United States Patent [19]

Nakashima et al.

[11] Patent Number: 5,661,086

[45] Date of Patent: Aug. 26, 1997

[54] PROCESS FOR MANUFACTURING A PLURALITY OF STRIP LEAD FRAME SEMICONDUCTOR DEVICES

[75] Inventors: Takashi Nakashima; Keiji Takai; Kouji Tateishi, all of Kitakyushu, Japan

[73] Assignee: Mitsui High-Tec, Inc., Kitakyushu, Japan

[21] Appl. No.: 584,299

[22] Filed: Jan. 11, 1996

[30] Foreign Application Priority Data

Mar. 28, 1995 [JP] Japan ................................ 7-096064
May 9, 1995 [JP] Japan ................................ 7-136019

[51] Int. Cl.$^6$ ............... H01L 21/48; H01L 21/52; H01L 21/58; H01L 21/60
[52] U.S. Cl. ............... 257/668; 438/111; 438/112; 438/118; 29/827
[58] Field of Search ............... 437/206, 207, 437/213, 214, 217, 218, 219, 224, 924

[56] References Cited

U.S. PATENT DOCUMENTS

| | | | |
|---|---|---|---|
| 4,980,219 | 12/1990 | Hiraide et al. | 428/134 |
| 4,981,817 | 1/1991 | Stone, Jr. | 437/206 |
| 5,182,851 | 2/1993 | Bond et al. | 29/827 |

FOREIGN PATENT DOCUMENTS

| | | | |
|---|---|---|---|
| 57-253 | 8/1982 | Japan | 437/206 |
| 1-128532 | 5/1989 | Japan | 437/206 |

*Primary Examiner*—David E. Graybill
*Attorney, Agent, or Firm*—Armstrong, Westermann, Hattori, McLeland & Naughton

[57] ABSTRACT

Method for producing semiconductor devices comprises a first step in which a plurality of metal substrates each of which is provided with a die mounting region at a central portion thereof are connected in series to produce a train of connected metal substrates by means of first connecting tabs and a pair of first side rails each of which is provided with first positioning pilot apertures are connected to the train by means of second connecting tabs to produce a metal substrate frame, a second step in which a plurality of circuit substrates each of which is provided with a lead pattern around an opening formed at the central portion thereof are connected in series by means of third connecting tabs to produce a train of connected circuit substrates and a pair of second side rails each of which is provided with second positioning pilot apertures are connected by fourth connecting tabs to produce a circuit substrate frame, a third step in which both frames are alinged with each other making use of the first and second positioning pilot apertures and are adhered with each other to produce a die mounting substrate frame, and a fourth step in which a semiconductor die is received in a cavity defined by the die mounting region and the opening of each die mounting substrate and solder balls are connected to terminal pads which form one ends of the lead pattern while pads of the semiconductor die are connected to wire bonding pads which form other ends of the lead pattern, and connecting tabs are removed so as to produce separate semiconductor devices.

10 Claims, 8 Drawing Sheets

Fig. 2
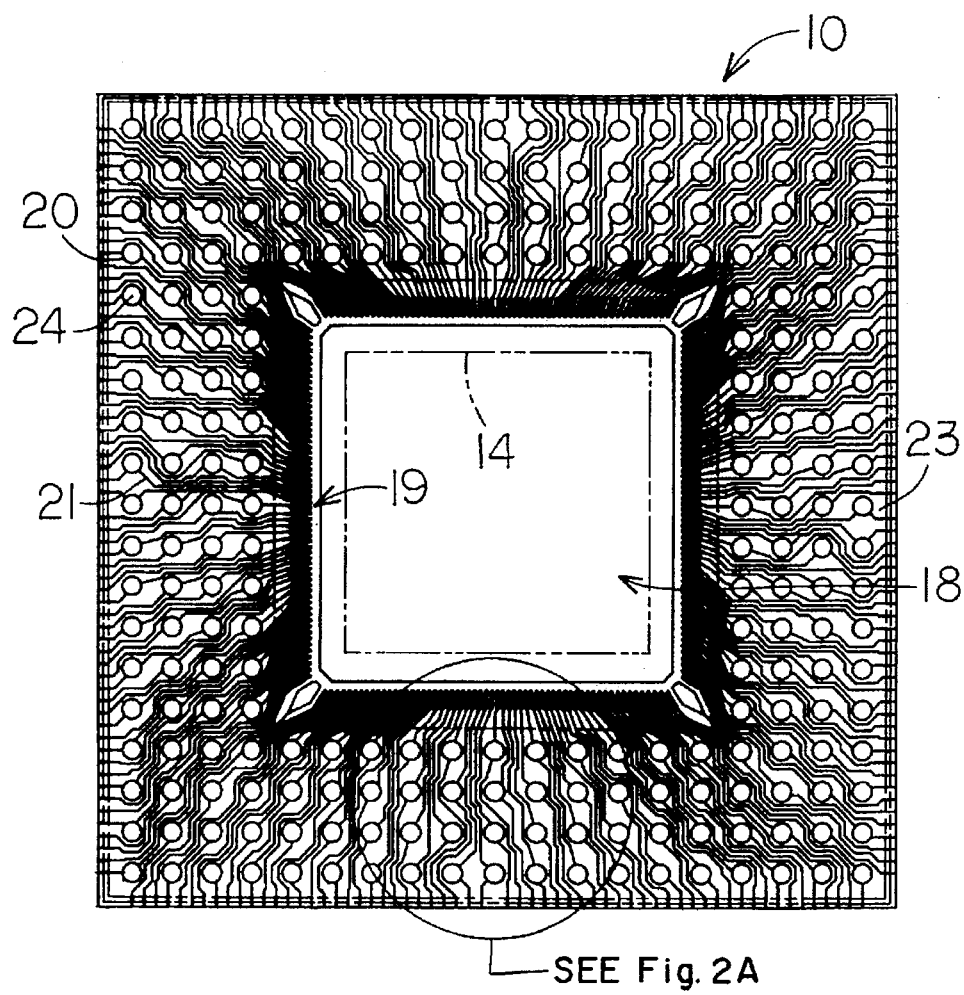
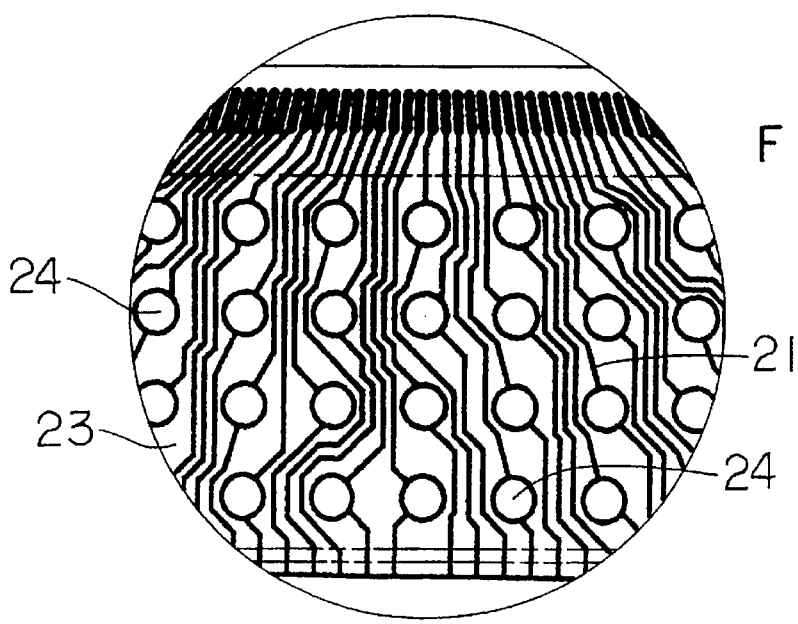
Fig. 2A

PROCESS FOR MANUFACTURING A PLURALITY OF STRIP LEAD FRAME SEMICONDUCTOR DEVICES

BACKGROUND OF INVENTION

The present invention relates to a method for producing BGA (ball grid array) type semiconductor devices, more particularly such BGA type semiconductor devices each of which is substantially made of semiconductor die mounting substrate which mounts a lead pattern on one surface thereof while making the other surface thereof adhered to a metal substrate which has a region on which a semiconductor die is mounted and the semiconductor devices produced by such a method.

Conventionally, the semiconductor devices such as IC (integrated circuit) and LSI (large scaled integrated circuit) are mounted in such a manner that a plurality of outer leads which are formed in a desired shape such as a J-shape or a gull-wing shape along an outer periphery of the semiconductor device are protruded outwardly and such outer leads are connected with corresponding mounting pads (or lands) of a wiring pattern formed on a mounting board of a printed wiring board (PWB) by soldering. This method, however, necessitates a relatively wide mounting region so that the method cannot meet a demand for compacting of the semiconductor devices.

For overcoming this drawback, recently, the semiconductor devices called BGA which use a plurality of solder balls as the outer connecting terminals of semiconductor devices thus realizing miniaturing of semiconductor dies, downsizing of the semiconductor devices and lowering of the production cost of the semiconductor devices have been proposed. Such devices are, for example, disclosed in U.S. Pat. specification No. 5,045,921 (Lin et al.), U.S. Pat. No. 5,216,278 (Lin et al), U.S. Pat. No. 5,397,921 (Karnezos), U.S. Pat. No. 5,420,460 (Massingill), Japanese laid-open patent publication HEI 3-99456 and Japanese laid-open patent publication HEI 4-277636. In mounting such semiconductor devices on the mounting board, soluble solder balls of each semiconductor device are first aligned with corresponding mounting pads or lands of the mounting board and subsequently are mounted on the mounting pads and the soluble solder balls are reflown by heating thus enabling a simultaneous mounting of all solder balls to the mounting pads of the mounting board facilitating the mounting of semiconductor devices on the mounting board.

The above-mentioned BGA type semiconductor devices have been produced, for example, by a following method.

Namely, using an etching method, a lead pattern made of first conductive leads and a die mounting region is formed on one surface of a TAB (Tape Automated Bonding) substrate or a glass fabrics reinforced epoxy resin substrate while a lead pattern made of second conductive leads is mounted on the other surface of the substrate thus producing a semiconductor die mounting substrate or a semiconductor chip carrier. On the surface of the semiconductor die mounting substrate which is provided with the lead pattern made of first conductive leads, a face-up type semiconductor die is mounted, wherein a plurality of electrode pads mounted on the surface of the semiconductor die are connected with a plurality of corresponding conductive leads by means of bonding wires made of, for example, gold wires to provide an electric conductive circuit.

Subsequently, an overmolding or a transfer resin molding is carried out so as to hermetically and integrally seal the semiconductor die, the bonding wires and the lead pattern made of the first leads thus producing a resin sealed body.

On the other surface of the semiconductor die mounting board which provides a lead pattern forming face and is provided with the second conductive leads which in turn are connected with the first conductive leads by way of through holes, a solder resist layer is formed while leaving terminal portions of the conductive leads being arrayed in a grid like circuit pattern exposed to an atmosphere by way of spaces. Then, the soluble solder balls are mounted in the spaces and such solder balls are heated and reflown to establish an electrical connection with the terminal portions of the conductive leads thus producing a semiconductor devices having ball-shaped outer terminals protruding outwarly from the lead pattern forming surface.

In the above-mentioned conventional method for producing the semiconductor devices, however, since the TAB board substrate or the glass fabrics reinforced epoxy resin substrate is used as the semiconductor chip carrier, the method is less than optimal in terms of dissipation of high temperature.

Furthermore, since the method uses the overmolding which provides a sealing mold only on one surface of the semiconductor die mounting substrate, the semiconductor device having a specific construction is bent or warped in an arc shape due to a thermal shrinkage of the resin thus the method cannot assure the uniformity in coplanality of the solder balls.

Still furthermore, as the resin and the circuit substrate are subjected to heating and cooling, due to the difference of the heat expansion rate between these two materials, the peeling off and cracks occur in the resin sealed body, thus giving rise to lowering of the production of the semiconductor devices thus hampering the productivity thereof.

Accordingly, it is an object of the present invention to provide a method for producing semiconductor devices, especially BGA type semiconductor devices which can overcome the above-mentioned drawbacks of the conventional method, wherein the method is preferably used in the manufacturing of semiconductor mounting substrates and can improve the trasferring and positioning efficiency at the time of mounting semiconductor dies on the semiconductor die mounting substrates thus enhancing the mounting of semiconductor dies and eventually the productivity of the semiconductor devices.

It is another object of the present invention to provide semiconductor devices which can be produced at a low cost with a high reliablity in mounting.

SUMMARY OF INVENTION

The first aspect of the present invention discloses a method for producing semiconductor devices comprising a) a first step for producing a frame made of connected metal substrates, wherein connected metal substrate members which comprise a plurality of metal substrate members each of which have a die mounting region at a central portion of a front surface thereof and which are connected in one direction by means of a plurality of first connecting tabs and a plurality of first side rails which are parallelly disposed at both sides of the metal substrate members and are connected with the metal substrate members by means of a plurality of second connecting tabs and are provided with a plurality of first positioning pilot apertures is formed from a copper material and subsequently an erosion preventing plating is applied to an entire surface of the metal substrate members to produce the connected metal substrates, b) a second step for producing a frame made of connected circuit substrates comprising following sub steps, i) a first sub step for shape forming wherein a plurality of circuit substrate members which are respectively provided with openings being aligned with the die mounting regions and are connected in one direction by means of a plurality of third connecting tabs and a plurality of second side rails which are parallelly disposed at both sides of the circuit substrate members and are connected with the metal substrate members by means of a plurality of fourth connecting tabs and are provided with a plurality of second positioning apertures being aligned with the first positioning pilot apertures formed from a substrate material sheet which is provided with a copper leaf on the front surface thereof, ii) a second sub step for producing lead pattern wherein an etching is made on the respective circuit substrate members so as to provide a plurality of conductive leads each of which forms a wire bonding pad at an inner end thereof and a terminal pad at an outer end, and the wire bonding pads and the terminal pads are provided with platings of a precious metal, iii) a third sub step for forming solder resist layer, wherein a solder resist layer is formed on the surface of the conductive leads with an exception of the wire bonding pads and the terminal pads, c) a third step for producing a frame made of connected semiconductor die mounting substrates wherein the frame made of connected metal substrates produced in the first step and the frame made of connected circuit substrates produced in the second step are aligned with each other using the first and second pilot apertures formed in the respective frames as reference apertures, a plurality of the circuit substrates are separated from the frame made of connected circuit substrates by removing the third and fourth connecting tabs and the separated circuit substrates are adhered to the respective metal substrates by means of an electrically insulating adhesive agent so as to produce the frame made of connected semiconductor die mounting substrates, and d) a fourth step for producing a plurality of independent semiconductor devices wherein a semiconductor die is mounted in a cavity defined by each die mounting region and each opening aligned with the die mounting portion, and a soluble solder ball is welded to the each terminal pad, and the first and second connecting tabs are removed from an outer frame including the first side rails so as to produce the independent semiconductor devices.

The second aspect of the present invention also discloses a semiconductor device produced by the above mentioned method for producing semiconductor devices of the first aspect of the invention, wherein the device comprises a) the metal substrate being made of copper oriented material coated with the erosion preventing plating, the metal substrate having the die mounting region at the central portion of the front surface thereof, b) the circuit substrate provided with a lead pattern on the front surface thereof, said circuit substrate having a back surface thereof adhered to a front surface of the metal substrate by way of a prepreg layer, the circuit substrate being provided with the opening which is aligned with the die mounting region of the metal substrate at the central portion thereof, the circuit substrate being provided with a desired number of the conductive leads each of which has the wire bonding pad at the inner end thereof and the terminal pad at the outer end thereof, wherein the wire bonding pad is exposed to the atmosphere and the terminal end is connected with the soluble solder ball, and the circuit substrate being provided with the solder resist layer coating the conductive leads with an exception of the terminal pads and the wire bonding pads, c) the semiconductor die being received in the cavity defined by the die mounting region of the metal substrate and the opening of the circuit substrate and adhered thereto by means of an electrially conductive adhesive, d) the bonding wire electrically connecting the wire bonding pads with corresponding pads of the semiconductor die, and e) a potting resin for hermetically sealing the semiconductor die mounted in the cavity and the bonding wires together with the wire bonding pads.

In this manner, according to the method for producing semiconductor devices of the first aspect of the prensent invention and the semiconductor device of the second aspect of the present invention, since the side rails attached to the frame made of connected metal substrates and the frame made of connected circuit substrates respectively are provided with first and second positioning pilot apertures for alignment respectively, the operability of the aligning operation which is inevitable in a step for adhering the circuit substrates to the respective metal substrates and ensuing steps such as a step for producing the frame made of the semiconductor dies mounting substrates can be enhanced.

Furthermore, since the mounting of the semiconductor device is carried out using the frame made of connected semiconductor die mounting substrates which are provided with positioning pilot apertures for alignment, the method of the present invention can produce the semiconductor devices making use of the existing lead frame type (metal frame type) facilities for production of semiconductor devices.

Furthermore, according to the method for producing semiconductor devices of the first aspect of the present invention and the semiconductor device of the second aspect of the present invention, the frame made of semiconductor die mounting substrates are produced in such a manner that the frame made of connected metal substrates which are made by connecting a plurality of metal substrates having semiconductor die mounting regions respectively and the frame made of connected circuit substrates which are made by connecting a plurality of circuit substrates are separately produced and then these frames are adhered with each other by way of a prepreg layer with a heat adhesion under pressure. Accordingly, compared to the conventional method in which the semiconductor die is mounted on the semiconductor die career which is exclusively made of flexible substrate material or glass fabrics reinforced epoxy resin, the strength of the career for supporting the circuit substrate can be enhanced so that bending or warping of the circuit substrate or dislocation of conductive leads which have occured due to the thermal shrinkage thereof in the conventional art can be prevented. The operability of mounting semiconductor dies is also enhanced since the metal substrate frame can be used for mounting the semiconductor dies.

The electrically insulating agent which is interposed between the metal substrate and the circuit substrate can absorb the difference of thermal expansion rate between the metal substrate and the circuit substrate so that the occurrence of thermal stress can be prevented.

Since the circuit substrate which is made of the flexible film or glass fabrics reinforced epoxy resin having a high heat resistance is provided with a plurality of conductive leads only on the mounting-surface side thereof which faces PWB, the circuit substrate can unnecessitate the boring of through via holes or forming of plating conductive layers in the through via holes. Accordingly, the solder balls can be readily mounted thus enhancing the operability and the reliability of mounting operation thereof. Silver paste or flux may preferably be used in mounting the solder balls so that the welding of the solder balls to the conductive leads is facilitated and the reliability of the welding is greatly enhanced.

Accordingly, the semiconductor devices can be automatically produced thus enabling the shortening of production time, simplification of the steps, the enhancement of the operability of semiconductor die mounting operation and high productivity of semiconductor devices at low cost.

In the above-mentioned method for producing semiconductor devices of the present invention, the erosion preventing plating in the first step may preferably be a nickel plating.

In the above-mentioned method for producing semiconductor devices of the present invention, the frame made of the connected metal substrates may preferably be produced by press working or an etching. The frame, however, may be produced by other methods.

In the above-mentioned method for producing semiconductor devices of the present invention, in case the semiconductor die is relatively thick, die mounting region of the frame made of the connected metal substrates in the first step may preferably be depressed downwardly with a sufficient depth so as to produce the die mounting regions having a recessed configuration.

In the above-mentioned method for producing semiconductor devices of the present invention, the solder balls may preferably be disposed at an outer periphery of the circuit substrate with a predetermined pitch in longitudinal and lateral directions forming a grid array.

BRIEF EXPLANATION OF DRAWINGS

FIGS. 2A and 2B are plan views of a semiconductor mounting surface of the semiconductor device wherein a semiconductor die is shown in an imaginary line.

DETAILED DESCRIPTION OF PREFERRED EMBODIMENT OF THE PRESENT INVENTION

The method for producing semiconductor devices according to one embodiment of the present invention will be explained in conjunction with the attached drawings.

Figure 1:
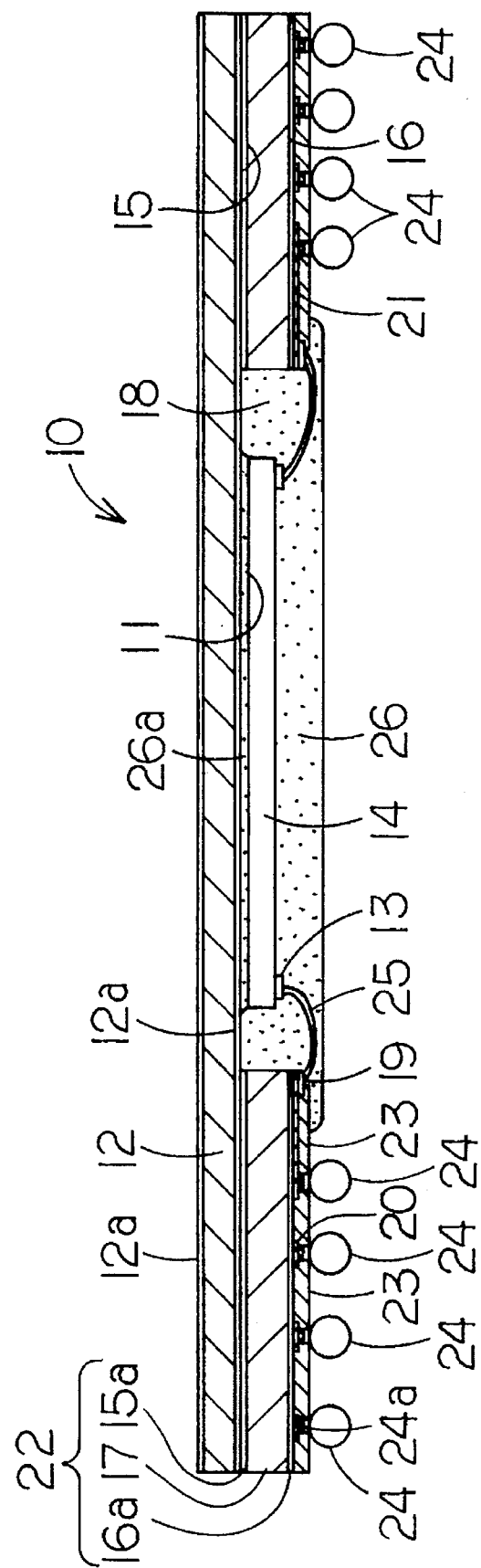
FIG. 1 is a cross sectional view of a semiconductor device produced by the method for producing semiconductor device according to the present invention.
Figure 3:
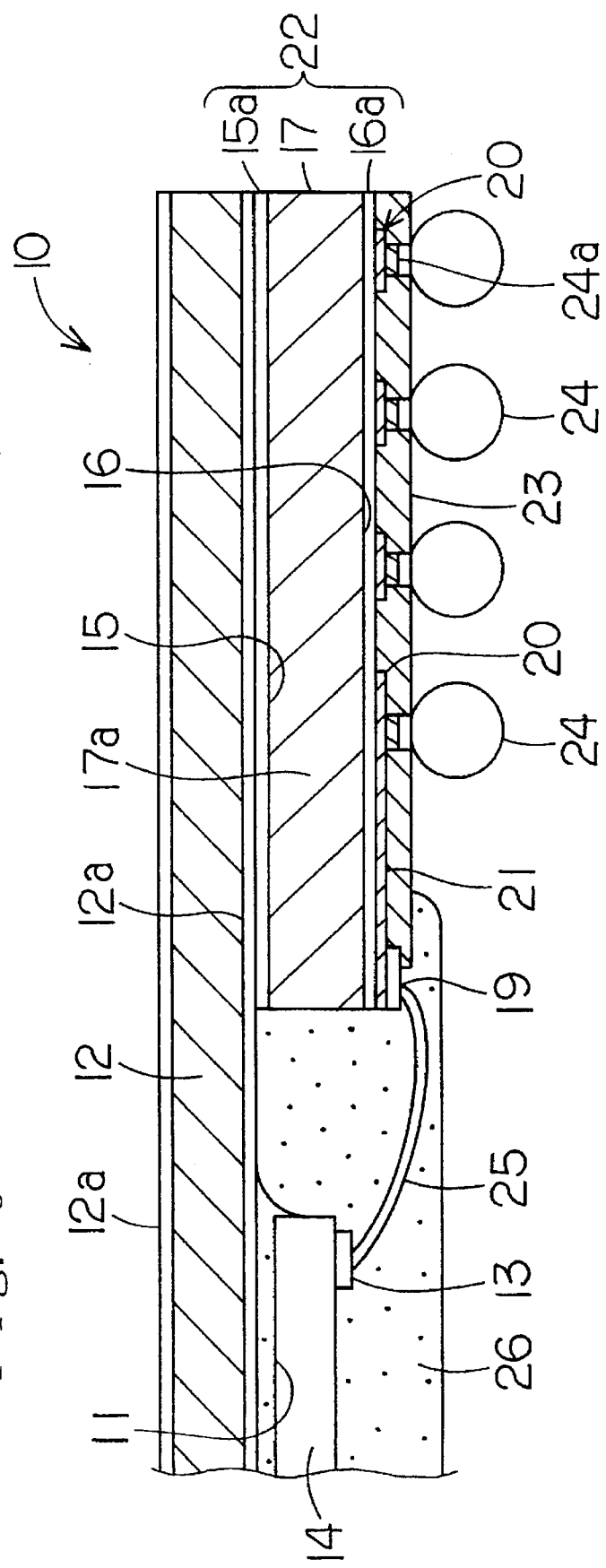
FIG. 3 is a partial cross sectional view of the semiconductor device.

An entire construction of a semiconductor device 10 produced by the above-mentioned method is first explained in conjunction with FIG. 1, FIG. 2 and FIG. 3.

The semiconductor device 10 according to this embodiment includes a metal substrate 12 made of a copper oriented material and a circuit substrate 17 which is adhered to a front surface of the metal substrate 12 by means of a prepreg layer 15a. This construction is explained in detail hereinafter.

The metal substrate 12 is made of the copper oriented material which has a favorable heat conductivity. The metal substrate 12 has a desired thickness (approximately 0.4 mm in this embodiment) and has a flat plane throughout the entire surface thereof. An erosion preventing treatment is applied to the metal substrate 12 such that the entire surface of the metal substrate 12 is covered with a coating layer 12a made of an erosion preventing plating. The coating layer 12a, for example, may be made of a nickel plating. The metal substrate 12 works as a base for mounting a semiconductor die 14 and, for this end, is provided with a die mounting region 11 at a central portion on the front surface thereof. The semiconductor die 14 is mounted on and adhered to the die mounting region 11 by means of an electrically conductive adhering agent 26a such as a silver paste.

The circuit substrate 17 is adhered to the front surface of the metal substrate 12 by means of the prepreg layer 15a and has a following construction. The circuit substrate 17 is provided with an opening 18 at the central portion thereof and such opening 18 is aligned or registered with the die mounting region 11 of the metal substrate 12 thus defining a cavity for accommodating the semiconductor die 14. The semiconductor die 14 is accommodated in the cavity and is adhered to die mounting region 11 of the metal substrate 12 by means of the electrically conductive adhering agent 26a. In this embodiment, the semiconductor die 14 has a thickness of approximately 0.4 mm while the circuit substrate 14 has a thickness of approximately 0.4 mm thus restricting the protruding of the semiconductor die 14 from the cavity when being accommodated in the cavity. The prepreg layer 15a is made of a glass fabrics impregnated with thermosetting resin.

The circuit substrate 17 is substantially made of a substrate 17a made of a glass fabrics reinforced epoxy resin and such a substrate 17a is provided with an adhering face 15 on the rear surface thereof and a mounting face 16 for a printed wiring board (PWB) on the front surface thereof. A copper leaf is adhered to the mounting face 16 of the substrate 17a by means of an adhering agent layer 16a. The opening 18 of the circuit substrate 17 can be readily formed by punching out a part of the substrate 17a by press working. It may be possible to use a prepreg layer as such an adhering agent layer 16a thus enhancing an electrical insulation of the circuit substrate 17.

Furthermore, The circuit substrate 17 is provided with a lead pattern made of a plurality of conductive leads 21 on the front surface thereof. Such a lead pattern can be formed by removing unnecessary parts of the copper leaf by an etching. The conductive leads 21 are arranged on the front surface of the circuit substrate 17 such that the conductive leads 21 encircle the opening 18. Each conductive lead 21 is provided with a wire bonding pad 19 on the inner end thereof and a terminal pad 20 at an outer end thereof. A nickel based gold plating is applied to all wire bonding pads 19 as well as all terminal pads 20. The wire bonding pads 19 are respectively connected with corresponding electrode pads 13 formed in the semiconductor die 14 by means of a plurality of bonding wires 25, while a plurality of solder balls 24 are mounted on the terminal pads 20 in such a manner that the solder balls 24 are distributed in longitudinal and lateral directions so as to provide a ball grid array.

A solder resist layer 23 made of acrylic oriented resin is applied to the entire front surface of the circuit substrate 17 which forms the mounting face 16 for the printed wiring board (PWB) by a conventional screen printing method. The solder resist layer 23, however, is not applied to such parts of the front surface of the circuit substrate 17 where the wire bonding pads 19 and the terminal pads 20 are disposed. Forming of such a solder resist layer 23 on the entire front surface of the circuit substrate 17 with an exception of the parts where the wire bonding pads 19 and the terminal pads 20 are disposed provides the prevention of the erosion of the conductive leads 21, the prevention of direct contacting of the conductive leads 21 with the PWB circuit and the prevention of spreading out of the solder ball 24 mounted on the terminal pads 20 which tends to occur at the time of reflowing the solder balls 24.

Furthermore, a potting resin 26 made of epoxy oriented resin and the like is filled in the cavity so as to provide a hermetic sealing or molding of the semiconductor die 14, the bonding wires 25 and the inner ends of the conductive leads 21. The potting resin 26 is designed so as to be sufficiently lower than the solder ball 24 in height so that the solder balls 24 can sufficiently protrude downwardly to be reliably connected with the PWB.

Different from the semiconductor devices provided with resin sealing or molding on one surface thereof using a conventional mold, the semiconductor device 10 having the above mentioned construction can effectively prevent the bending thereof as well as the cracking thereof which occurs as the result of such a bending so that the productivity and mounting reliability of the semiconductor devices 10 can be greatly enhanced and the cost for mounting can also be decreased.

Figure 4:
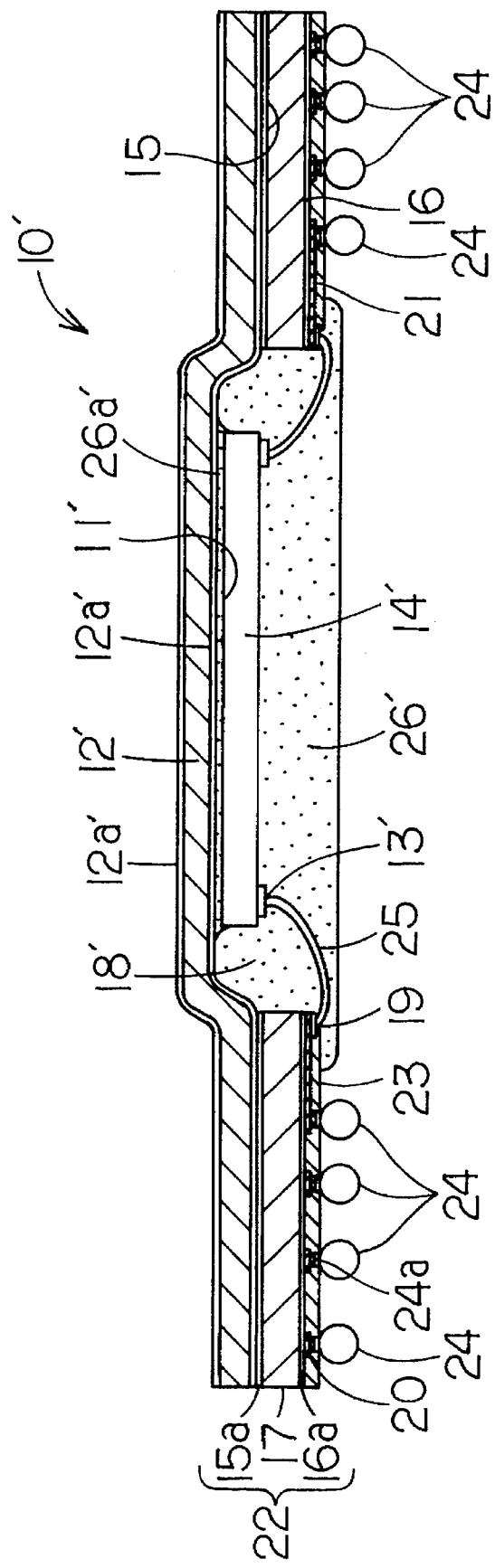
FIG. 4 is a cross sectional view of the semiconductor device of a modification of the present invention.

In FIG. 4, a semiconductor device 10' according to a modification of this embodiment is shown.

As shown in FIG. 4, a die mounting region 11' which is disposed at the central portion of a metal substrate 12' is depressed so as to form a recess. Due to such a construction, even when a relatively thick semiconductor die 14' is mounted on the die mounting portion 11', the difference of level between wire bonding pads 19 of conductive leads 21 and electrode pads 13' of the semiconductor dies 14' can be minimized. Accordingly, the operability of wire bonding operation is enhanced and a potting resin 26' is prevented from protruding or bulging thereof so that the semiconductor device 10' having the relatively thick semiconductor die 14' (approximately 0.5 mm in this embodiment) can be readily mounted on PWB without any problems. In this modification, parts of the semiconductor device 10' which have the same construction and the same function are given the same numerals and the explanation of these parts are omitted.

The method according to the embodiment of the present invention for producing semiconductor devices having the above-mentioned construction is hereinafter explained in conjunction with attached drawings FIG. 5 to FIG. 12.

Figure 5:
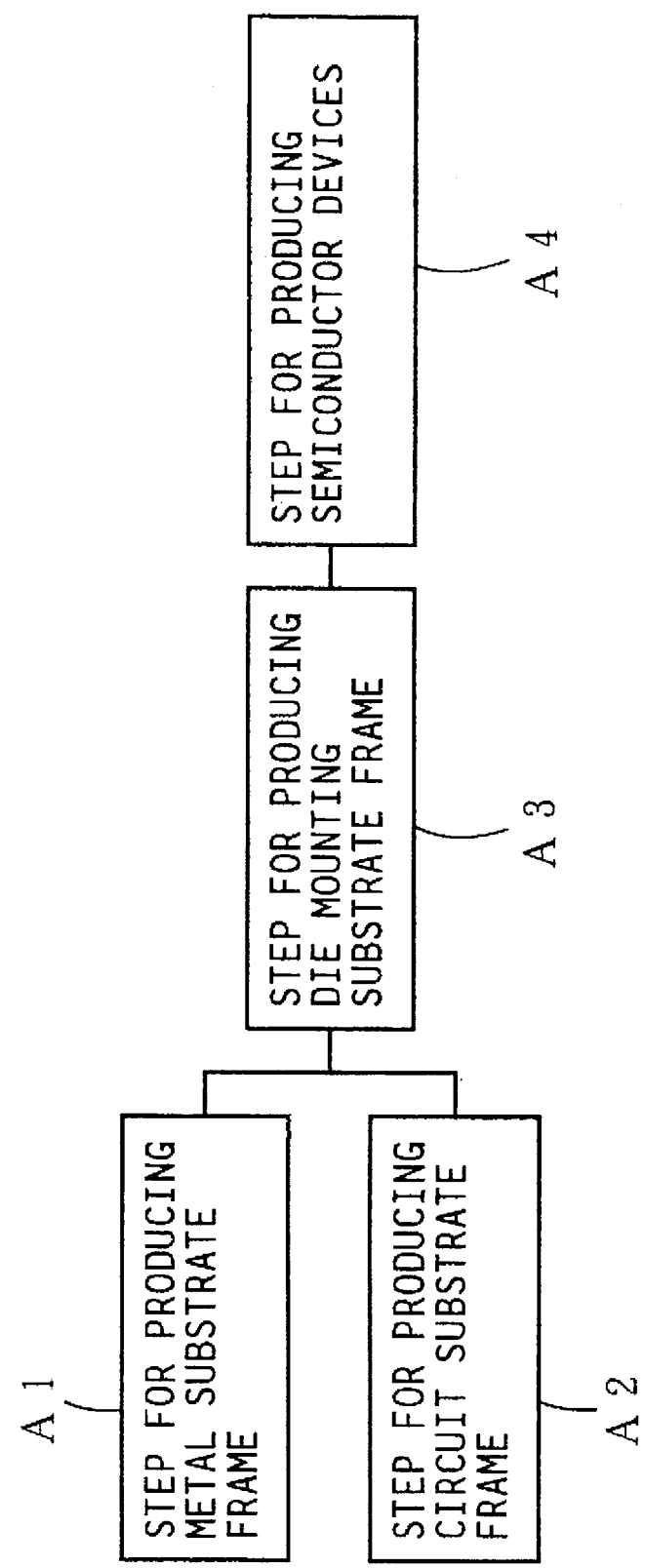
FIG. 5 is a block diagram showing the production steps of the method for producing semiconductor devices according to the present invention.

As shown in FIG. 5, the method comprises a first step A1 for producing a metal substrate frame 33, a second step A2 for producing a circuit substrate frame 52, a third step A3 for producing a die mounting substrate frame 53 and a fourth step A4 for producing independent or separate semiconductor devices 10 by mounting the semiconductor dies 14 on the connected die mounting frame 53 and adhering the solder balls 24 and the like to the terminal pads 20 and then removing the side rails 31 and the like from the die mounting substrate frame 53.

The above-mentioned steps are explained respectively hereinafter in conjunction with FIG. 6 to FIG. 13.

Figure 6:
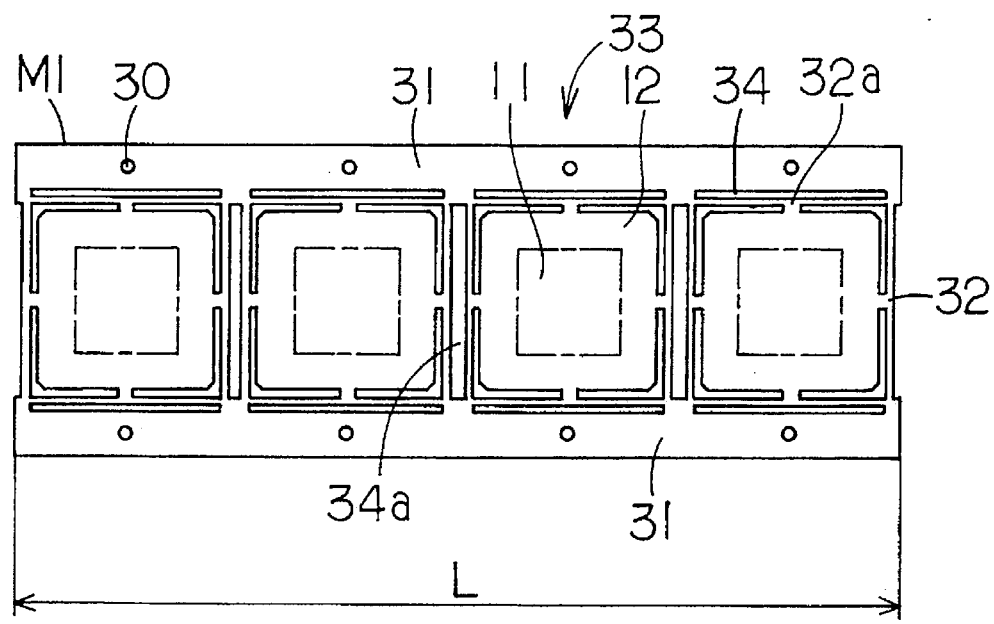
FIG. 6 is a plan view of a frame made of connected metal substrates produced in a step of the above method for producing such a frame.

The first step A1 for producing the metal substrate frame 33 is firstly explained in conjunction with FIG. 6, wherein FIG. 6 shows such a frame 33 produced by the first step A1.

The first step A1 substantially comprises following first to third sub steps a) to c).

The first sub step a) is a press working step to produce a train of connected metal substrates 12.

In this step a), copper oriented substrate material M1 which has a favorable heat conductivity is reeled out from a coil and the substrate material is subjected to press working which is carried in several stages sequentially making use of several presses which are arranged in sequence so as to punch out the substrate material M1 sequentially. These presses are not shown in the drawings. Due to such press working, the substrate material M1 is sequentially punched out such that a plurality of metal substrates 12 each of which is provided with the approximately square die mounting region 11, a pair of first side rails 31 which are disposed at both sides of the metal substrates 12 and have a plurality of first positioning pilot apertures 30 in a longitudinal direction at a desired pitch and a plurality of first and second connecting tabs 32,32a for connecting the metal substrates 12 with each other in series and for connecting the metal substrates 12 with the first side rails 31 are remained. The connecting tabs 32, 32a are remained at four corners of each metal substrate 12.

The second sub step b) is a plating step in which the coating layer 12a made of an errosion preventing layer such as nickel plating (see FIG. 1) is formed on the entire surface of the connected metal substrates 12 in a known method.

The third sub step c) is a cutting step in which a train made of connected metal substrates 12 each of which is provided with the coating layer 12a such as a nickel plating is cut at a desired interval L in a longitudinal direction.

Through these sub steps, as shown in FIG. 6, a strip-like metal substrate frame 33 which is made of a plurality of metal substrates 12 can be produced. The metal substrate frame 33 thus produced is fed to the third step A3 for producing the die mounting substrate frame 53.

Although the metal substrate frame 33 is produced by connecting four metal substrates 12 in this embodiment as shown in FIG. 6, the metal substrate frame 33 can be produced by connecting more than five metal substrates 12 and then is fed to the third step A3.

Although the metal substrate frame 33 is produced by press working in this embodiment as shown in FIG. 6, the metal substrate frame 33 can be produced by a conventional etching.

Furthermore, although, in this embodiment, as shown in FIG. 1, the die mounting region 11 of each metal substrate 12 of the metal substrate frame 33 is disposed coplanary with other parts of the front surface of the metal substrate 12, the die mounting region 11' can be indented or recessed using depressing means as shown in FIG. 4 so as to accommodate the relatively thick semiconductor die 14'. In this case, by forming a plurality of slits 34, 34a which encircle the the metal substrate 12 as shown in FIG. 6, working strains which may occur at the time of drawing the metal substrate 12 to produce the recessed die mounting portion 11' can be restricted.

Furthermore, it may be possible to carry out the heat treatment on the metal substrate frame 33 after the metal substrate frame 33 is produced from a plurality of metal substrates 12 so as to remove the internal stress remained in the metal substrate frame 33. Due to such a heat treatment, deformation of the metal substrates 12 which may be caused upon releasing internal stress by heating in an ensuing assemblying operation can be prevented beforehand.

Figure 7:
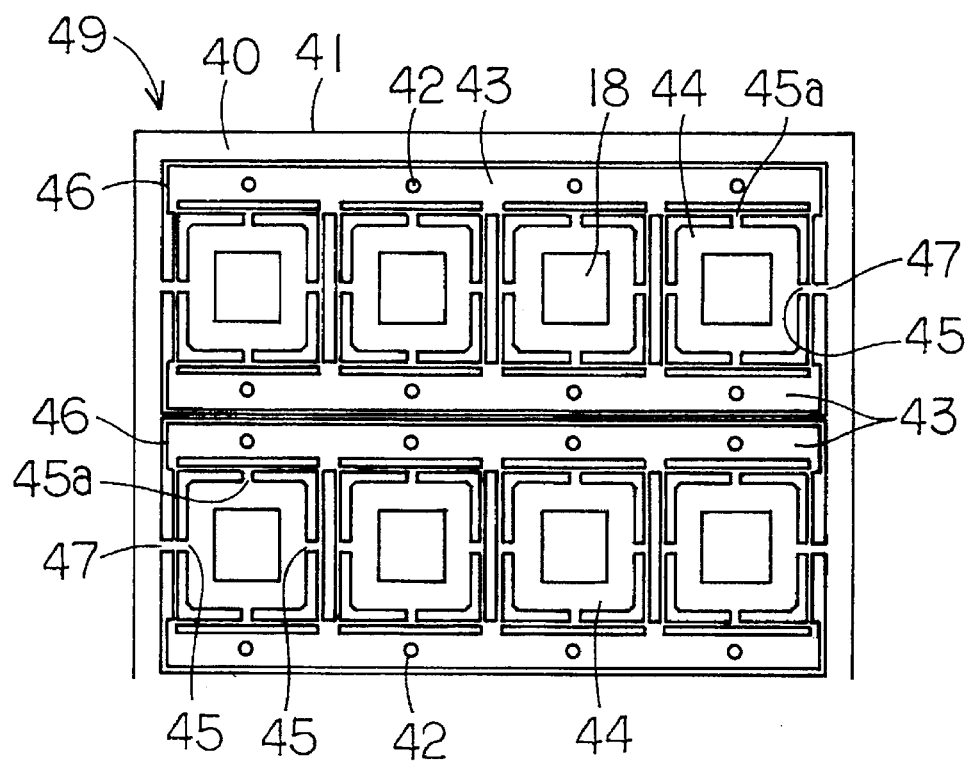
FIG. 7 is a plan view of a sheet for producing connected substrate members used in a step of the above method for producing a frame made of circuit substrates.
Figure 8:
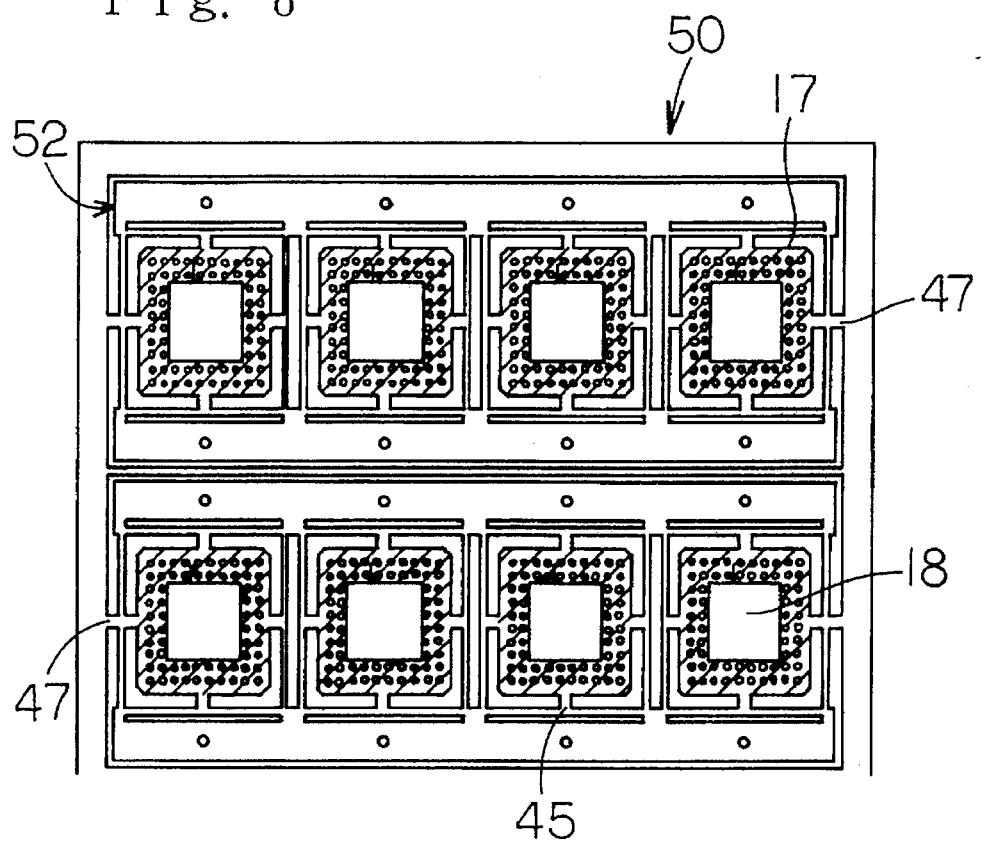
FIG. 8 is a plan view of a sheet made of connected circuit substrates produced by providing conductive circuits to respective connected substrate members shown in FIG. 7.
Figure 9:
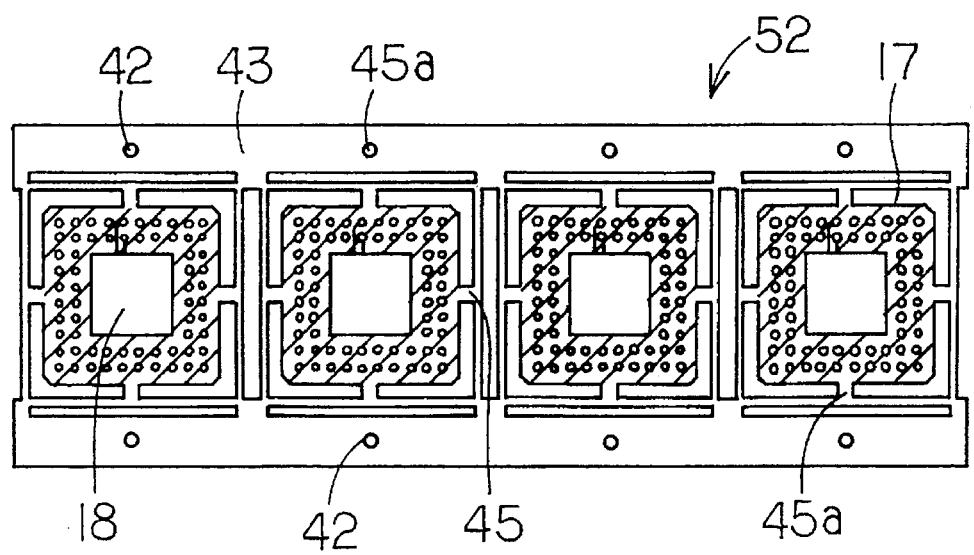
FIG. 9 is a plan view showing a frame made of connected circuit substrates separated from the sheet made of connected circuit substrates shown in FIG. 8.

The second step A2 for producing a circuit substrate frame 52 made of connected circuit substrates 17 is explained in conjunction with FIG. 7, FIG. 8 and FIG. 9.

The second step A2 substantially comprises following first sub step a) to the fourth step d).

The first sub step a) is a shape forming step which eventually produces a sheet 49 made of connected substrate members.

In this sub step a), a substrate material sheet 41 made of glass fabrics reinforced epoxy resin material which is provided with a copper leaf on the surface thereof is subjected to press working which is carried in several stages sequentially making use of several presses which are arranged in sequence so as to punch out the substrate material sheet 41 sequentially. These presses are not shown in the drawings. Due to such press working, the substrate material sheet 41 is sequentially punched out such that the sheet 49 made of connected substrate material members is produced. The sheet 49 is made of a plurality of frames 46 made of connected substrate members which are connected with an outer frame 48 by means of a plurality of supporting tabs 47. The frame 46, in turn, is made of a plurality of circuit substrate members 44 which are longitudinally connected with each other by means of a plurality of third connecting tabs 45 and are connected with a pair of second side rails 43 which are parallelly disposed at both sides thereof by means of a plurality of fourth connecting tabs 45a. In the above-mentioned construction, second side rails 43 are respectively provided with a plurality of second positioning pilot apertures 42 which are spaced apart in a longitudinal direction. Each circuit substrate member 44 has an approximately square shape and is provided with the opening 18 at the central portion thereof which is aligned or registered with the die mounting region 11 of the metal substrate frame 33.

The second sub step b) is a lead pattern forming step. In this step b), a conventional etching is applied to the surface of the sheet 49 made of connected circuit substrate members, wherein the surface is provided with the copper leaf 40. The wire bonding pads 19 are arranged along the inner periphery of each circuit substrate member 44 which encircles the opening 18 while a plurality of terminal pads 20 used for outer connections are distributed in a grid array manner along the outer periphery of each circuit substrate member 44. The wire bonding pads 19 and the terminal pads 20 are connected so as to form a lead pattern. Such a lead pattern is coated with a nickel based gold plating.

The third sub step c) is a solder resist layer forming step. In this step c), the solder resist layer 23 is formed on the front surface of each circuit substrate member 44 using a well known screen printing method with an exception of the parts of the front surface of the each circuit substrate member 44 where the wire bonding pads 19 and the terminal pads 20 of the lead pattern which is covered with nickel based gold plating are exposed to an atmosphere through spaces 24a to produce a sheet 50 made of connected circuit substrates shown in FIG. 8.

The fourth sub step d) is a frame separating step. In this step d), the connecting tabs 47 are removed from the sheet 50 so as to produce a strip-like circuit substrate frame 52 made of connected circuit substrates.

In this step, although the substrate member material sheet 41 for producing the circuit substrate frame 52 made of connected circuit substrates is made of the glass fabrics epoxy resin sheet, a flexible film substrate sheet made of an electrically insulating material such as polyimide can be used as such substrate member material sheet 41.

In this case, a multiplicity of circuit substrates 17 can be formed in a tape which in turn can be rolled in a coil and such a tape is fed to a subsequent step, namely, the third step A3 where a die mounting substrate frame 53 made of connected semiconductor mounting substrates is produced. In this third step, with such a tape, the die mounting substrate frame 53 shown in FIG. 10 can be efficiently produced.

Furthermore, although, the conductive leads 21 has the entire surfaces thereof coated with the nickel based gold plating in the method for producing semiconductor devices according to this embodiment, it is possible to apply such nickel based gold plating exclusively to the wire bonding pads 19 and the terminal pads 20. As shown in FIG. 1 and FIG. 2, the conductive leads 21 are extended outwardly beyond the terminal ends 20 so that each conductive lead 21 is connected with a frame like plating electrode which works as a common terminal in an electroplating.

For forming the metal substrate 12' having a depressed recess as shown in FIG. 4, the depressing of a desired depth is carried out in the previous shape forming sub step by press working.

Although, in this embodiment, the second step A2 for producing the circuit substrate frame 52 made of connected circuit substrates includes the frame separating sub step d), such a step d) may be unnessitated provided that the substrate material sheet 41 having a narrow width is used.

The third step A3 for producing the die mounting substrate frame 53 is explained hereinafter in conjunction with FIG. 10.

The third step A3 comprises following first sub step a) and second sub step b).

The first sub step a) is a separation and adhering step in which the respective circuit substrates 17 of the circuit substrate frame 52 fed to the third step A3 from the second step A2 are aligned with the respective metal substrates 12 of the metal substrate frame 33 fed to the third step A3 from the first step A1 with a desired gap therebetween making use of positioning pilot apertures 30,42 formed in side rails 31 of the metal substrate frame 33 and the side rails 42 of the circuit substrate frame 52.

The respective circuit substrates 17 are separated from the die mounting substrate frame 53 by terminating the third and fourh connecting tabs 45,45a by means of a press not shown in the drawings and such separated circuit substrates 17 are temporarily adhered to the respective metal substrates 12 of the strip-like metal substrate frame 33 by means of the prepreg layers 15a disposed on the metal substrate frame 33 in place.

The second sub step b) is a heat adhering step in which each circuit substrate 17 is adhered to the corresponding metal substrate 12 of the metal substrate frame 33 with heat under pressure by a well known heat adhesion press working which is used in the manufacturing of multi-layered printed board.

Figure 10:
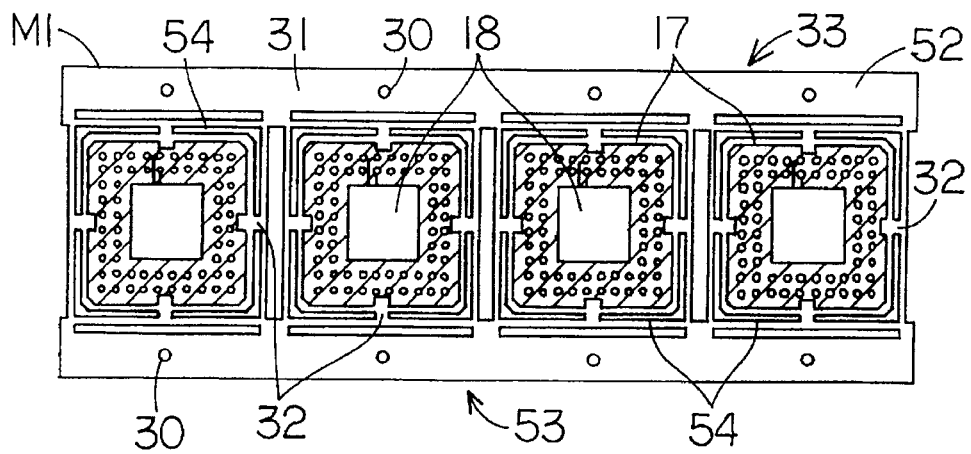
FIG. 10 is a plan view of a frame made of connected semiconductor die mounting substrates.

Through these sub steps a) and b), the die mounting substrate frame 53 made of connected semiconductor die mounting substrates 54 each of which is provided with the cavity for accommodating the semiconductor die 14 at the central portion thereof can be produced as shown in FIG. 10.

To recapitulate, in this third step A3, the die mounting substrate frame 53 is substantially produced by the metal substrate frame 33 and the circuit substrate frame 52. Such a die mounting substrate frame 53 can be produced in such a manner that a connected body made of a plurality of contiguous metal substrates 12 having the first positioning pilot apertures 30 respectively and a connected body made of a plurality of contiguous circuit substrates 17 having second positioning pilot apertures 42 respectively are first prepared, subseqeuntly these connected bodies are aligned with each other with reference to the these positioning pilot apertures 30, 42, and the respective circuit substrates 17 are separated and removed from each other by press working, these separated circuit substrates 17 are adhered to the metal substrates 12 thus producing a connected body made of a multiplicity of contiguous die mounting substrates 54, and finally the connected body is cut in desired longitudinal intervals to produce the die mounting substrate frame 53 made of connected die mounting substrates 54 shown in FIG. 10. Such a manufacturing procedure can further enhance the operability of the step for producing the die mounting substrate frame 53.

Furthermore, it is possible to add a pressure curing sub step after the heat adhering sub step so as to remove the internal stress remaining in the die mounting substrate frame 53. With such a heat adhering sub step, the bending or warping of the semiconductor device 10 which may be caused by heating hysteresis in the subsequent step can be prevented.

The fourth step A4 is explained hereinafter in conjunction with FIG. 11. In this step, the semiconductor dies 14 are mounted on the die mounting substrate frame 53 and then the first and second connecting tabs 32, 32a are removed so as to produce a plurality of independent or separate semiconductor devices 10.

The fourth step A4 substantially comprises following first sub step a) to fifth sub step e).

The first sub step a) is a die mounting step for mounting the semiconductor dies 14 on the die mounting substrate frame 53. Namely, in this step, the semiconductor dies 14 are mounted in the cavities respectively formed in the die mounting substrates 54 of the die mounting substrate frame 53 fed to the fourth step A4 from the third step A3 by means of the electrically conductive adhering agent 26a.

The second sub step b) is a wire bonding step in which a plurality of bonding wires 25 have one ends thereof connected with corresponding electrode pads 13 of each semiconductor dies 14 and the other ends connected with corresponding wire bonding pads 19 of the circuit substrates 17 thus establishing an electrical conductive circuit.

Figure 11:
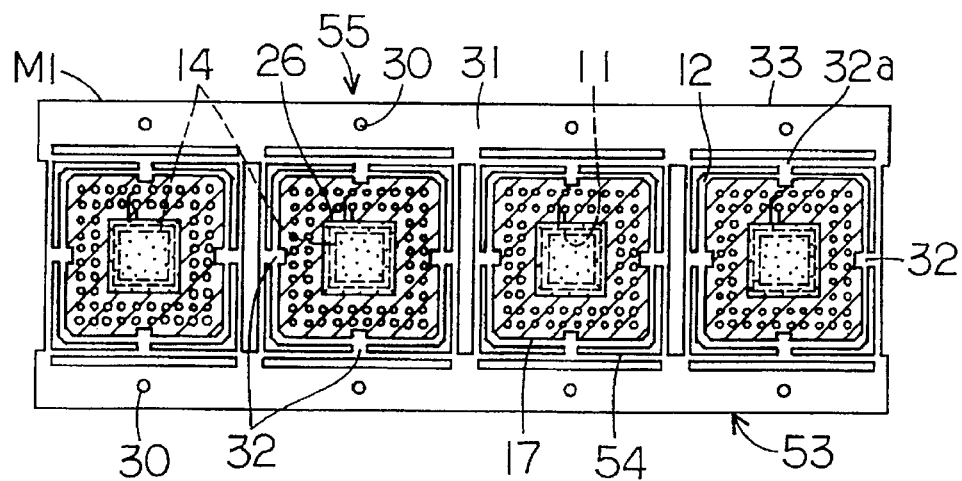
FIG. 11 is a plan view of a frame for mounting semicondutor dies on the frame made of connected die mounting substrates shown in FIG. 10.

The third sub step c) is a resin sealing or molding step in which the semiconductor dies 14, the bonding wires 25 and a part of the solder resist layer 23 are hermetically sealed by the potting resin 26 so as to produce a semiconductor die mounted frame 55 shown in FIG. 11.

Figure 12:
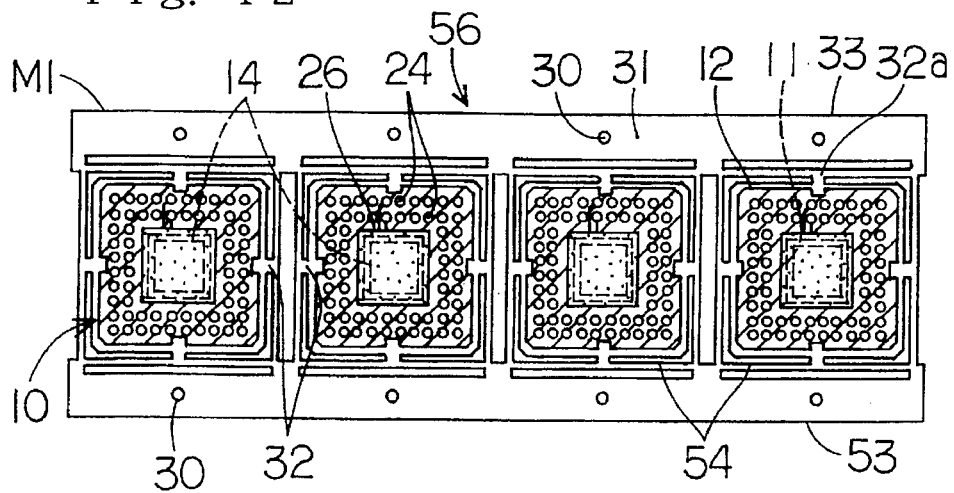
FIG. 12 is a plan view showing a frame made of connected semiconductor devices by providing solder balls on the frame made of semiconductor die mounted substrates shown i FIG. 11.

The fourth sub step d) is a solder ball welding step for producing a frame 56 made of connected semiconductor devices as shown in FIG. 12. In this sub step, the soluble solder balls 24 are mounted on a plurality of terminal pads 20 which are distributed in a grid array on the respective die mounting substrates 54 of the frame 55. The solder balls 24 are reflown so as to be connected with the terminal pads 20 thus forming outer terminals which protrude outwardly from the solder resist layer 23.

The fifth sub step e) is a step for completing the semiconductor device 10 in which the first and second connecting tabs 32, 32a which are employed for connecting a plurality of semiconductor devices 10 are removed so as to produce the semiconductor devices 10 as shown in FIG. 1.

As has been described heretofore, in the method for producing semiconductor devices according to this embodiment, the respective metal substrates 12 which are connected to constitute the metal substrate frame 33 having first positioning pilot apertures 30 are used as bases. Subsequently, on these bases, the circuit substrates 17 which are connected to constitute the circuit substrate frame 52 having second positioning pilot apertures 42 are adhered with pressure to form the die mounting substrate frame 53 which works as a semiconductor die mounted career and the semiconductor dies 14 are mounted on the die mounting substrate frame 53.

Accordingly, while overcoming the problem of the conventional technique which is caused by using the plastic substrate such as the semiconductor chip career that it suffers from the poor dessipation of heat and therefore the semiconductor device which requires a high heat dessipation property cannot be mounted, the method according to the present invention can automatically produce the semiconductors having high heat dessipation property, enabling shortening of production time, simplification of production steps and enhancement of operability of semiconductor mounting operation. Namely, the method for producing semiconductor devices according to the prensent invention can produce semiconductor devices at high productivity and at low cost.

Furthermore, in the method for producing semiconductor devices according to this invention, as shown in FIG. 7, although the outer frame 48 is provided around the frame 46 made of connected metal substrate members, such a frame 48 can be omitted by choosing the frame 46 of a desired size.

Still furthermore, although, in the method for producing semiconductor devices according to this invention, the forming of lead pattern on the respective circuit substrate 17 by etching or the like is carried out before adhering the circuit substrate 17 to the metal substrate 12, it is possible to carry out such a lead pattern forming operation after such adhering of the circuit substrate 17 to the metal substrate 12.

Although one embodiment has been described in detail herein with reference to the accompanying drawings, it is understood that the invention is not limited to these precise embodiments, and that various changes and modifications may be effected therein by one skilled in the art without departing from the scope or spirit of the invention as defined in the appended claims.

We claim:

1. A method for producing semiconductor devices comprising:

a) a first step for producing a frame made of connected metal substrates, wherein connected metal substrate members which comprise a plurality of metal substrate members each of which have a die mounting region at a central portion of a front surface thereof and which are connected in one direction by means of a plurality of first connecting tabs and a plurality of first side rails which are disposed in parallel at both sides of said metal substrate members and are connected with said metal substrate members by means of a plurality of second connecting tabs and are provided with a plurality of first positioning pilot apertures are formed from a copper material and subsequently an erosion preventing plating is applied to an entire surface of said metal substrate members to produce said connected metal substrates, b) a second step for producing a frame made of connected circuit substrates comprising the following sub-steps,
 i) a first shape forming sub step wherein a plurality of circuit substrate members which are respectively provided with openings being aligned with said die mounting regions and are connected in one direction by means of a plurality of third connecting tabs and a plurality of second side rails which are disposed in parallel at both sides of said circuit substrate members and are connected with said metal substrate members by means of a plurality of fourth connecting tabs and are provided with a plurality of second positioning apertures being aligned with said first positioning pilot apertures formed from a substrate material sheet which is provided with a copper leaf on a front surface thereof,
 ii) a second lead pattern producing sub-step wherein an etching is made on said circuit substrate members so as to provide a plurality of conductive leads each of which forms a wire bonding pad at an inner end thereof and a terminal pad at an outer end, and said wire bonding pads and said terminal pads are provided with platings of a metal,
 iii) a third solder resist layer forming sub-step, wherein a solder resist layer is formed on a surface of said conductive leads with an exception of said wire bonding pads and said terminal pads, c) a third step for producing a frame made of connected semiconductor die mounting substrates wherein said frame made of connected metal substrates produced in said first step and said frame made of connected circuit substrates produced in said second step are aligned with each other using said first and second positioning pilot apertures formed in said frames as reference apertures, a plurality of said circuit substrates are separated from said frame made of connected circuit substrates by removing said third and fourth connecting tabs and said separated circuit substrates are adhered to said metal substrates by means of an electrically insulating adhesive agent so as to produce said frame made of connected semiconductor die mounting substrates, and d) a fourth step for producing a plurality of independent semiconductor devices wherein a semiconductor die is mounted in a cavity defined by each said die mounting region and each said opening aligned with each said die mounting portion, and a solder ball is welded to each said terminal pad, and said first and second connecting tabs are removed from an outer frame including said first side rails so as to produce said independent semiconductor devices.

2. A method for producing semiconductor devices according to claim 1, wherein said erosion preventing plating is a nickel plating.

3. A method for producing semiconductor devices according to claim 1, wherein said frame made of said metal substrates is produced by a press treatment.

4. A method for producing semiconductor devices according to claim 1, wherein said frame made of said metal substrates is produced by an etching treatment.

5. A method for producing semiconductor devices according to claim 1, wherein said die mounting portions of said metal substrate frame is depressed so as to produce said die mounting portions having a recessed configuration.

6. A semiconductor device produced by said method for producing semiconductor devices according to claim 1, wherein said device comprises,
 a) said metal substrate being made of copper material coated with said erosion preventing plating, said metal substrate having said die mounting region at said central portion of said front surface thereof,
 b) said circuit substrate having a rear surface thereof adhered to a front surface of said metal substrate by way of a prepreg layer, said circuit substrate being provided with said opening which is aligned with said die mounting region of said metal substrate at said central portion thereof, said circuit substrate being provided with said conductive leads each of which has said wire bonding pad at said inner end thereof and said terminal pad at said outer end thereof, wherein said wire bonding pad is exposed to the atmosphere and said terminal end is connected with said solder ball, and said circuit substrate forming a lead pattern on said front surface thereof and being provided with said solder resist layer coating said conductive leads with an exception of said terminal pads and said wire bonding pads,
 c) said semiconductor die being received in said cavity defined by said die mounting region of said metal substrate and said opening of said circuit substrate,
 d) bonding wires electrically connecting said wire bonding pads with corresponding pads of said semiconductor dies, and
 e) a potting resin for hermetically sealing said semiconductor die mounted in said cavity and said bonding wires together with said wire bonding pads.

7. A semiconductor device according to claim 6, wherein said solder balls are disposed at an outer periphery of said circuit substrate with a pitch in longitudinal and lateral directions forming a grid array.

8. A semiconductor device according to claim 6, wherein a material of said circuit substrate is glass cloth epoxy resin.

9. A semiconductor device according to claim 6, wherein a material of said circuit substrate is electrically insulated film.

10. A semiconductor device according to claim 6, wherein said die mounting region of said metal substrate is indented from a conductive lead region which encircles said die mounting region so as to make a height of pads of said semiconductor die substantially equal to a height of said wire bonding pads which are arranged around said pads of said semiconductor die.

* * * * *